(12) United States Patent
Patel et al.

(10) Patent No.: US 7,436,060 B2
(45) Date of Patent: Oct. 14, 2008

(54) SEMICONDUCTOR PACKAGE AND PROCESS UTILIZING PRE-FORMED MOLD CAP AND HEATSPREADER ASSEMBLY

(75) Inventors: Pradip Patel, Redwood City, CA (US); Maurice O. Othieno, Union City, CA (US); Manickam Thavarajah, San Jose, CA (US); Severino A. Legaspi, Jr., Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 587 days.

(21) Appl. No.: 10/865,179

(22) Filed: Jun. 9, 2004

(65) Prior Publication Data

US 2005/0275086 A1     Dec. 15, 2005

(51) Int. Cl.
*H01L 23/36* (2006.01)

(52) U.S. Cl. ............... 257/717; 257/706; 257/E23.101

(58) Field of Classification Search ................ 257/675, 257/699, 704–710, 712, 713, 717, E23.104, 257/E23.106, E23.101
See application file for complete search history.

(56) References Cited

U.S. PATENT DOCUMENTS

| 4,829,403 A | * | 5/1989 | Harding | 361/704 |
|---|---|---|---|---|
| 5,583,377 A | * | 12/1996 | Higgins, III | 257/707 |
| 5,691,567 A | * | 11/1997 | Lo et al. | 257/675 |
| 5,977,626 A | * | 11/1999 | Wang et al. | 257/707 |
| 6,376,769 B1 | * | 4/2002 | Chung | 174/524 |
| 6,903,457 B2 | * | 6/2005 | Nakajima et al. | 257/717 |
| 2004/0150097 A1 | * | 8/2004 | Gaynes et al. | 257/704 |

\* cited by examiner

*Primary Examiner*—Marcos D. Pizarro
(74) *Attorney, Agent, or Firm*—Beyer Law Group LLP

(57) ABSTRACT

A semiconductor integrated circuit package incorporating a preformed one-piece mold cap and heatspreader assembly is disclosed. One implementation includes a substrate with a die attached to the substrate. The die is electrically connected with electrical connections formed on the substrate using bonding wires. A preformed one-piece integrated mold cap and heatspreader assembly attached to the substrate to enclose at least a portion of the bonding wires and the die. Methods of assembling semiconductor integrated circuit packages using a preformed one-piece integrated mold cap and heatspreader assembly are also disclosed.

14 Claims, 3 Drawing Sheets

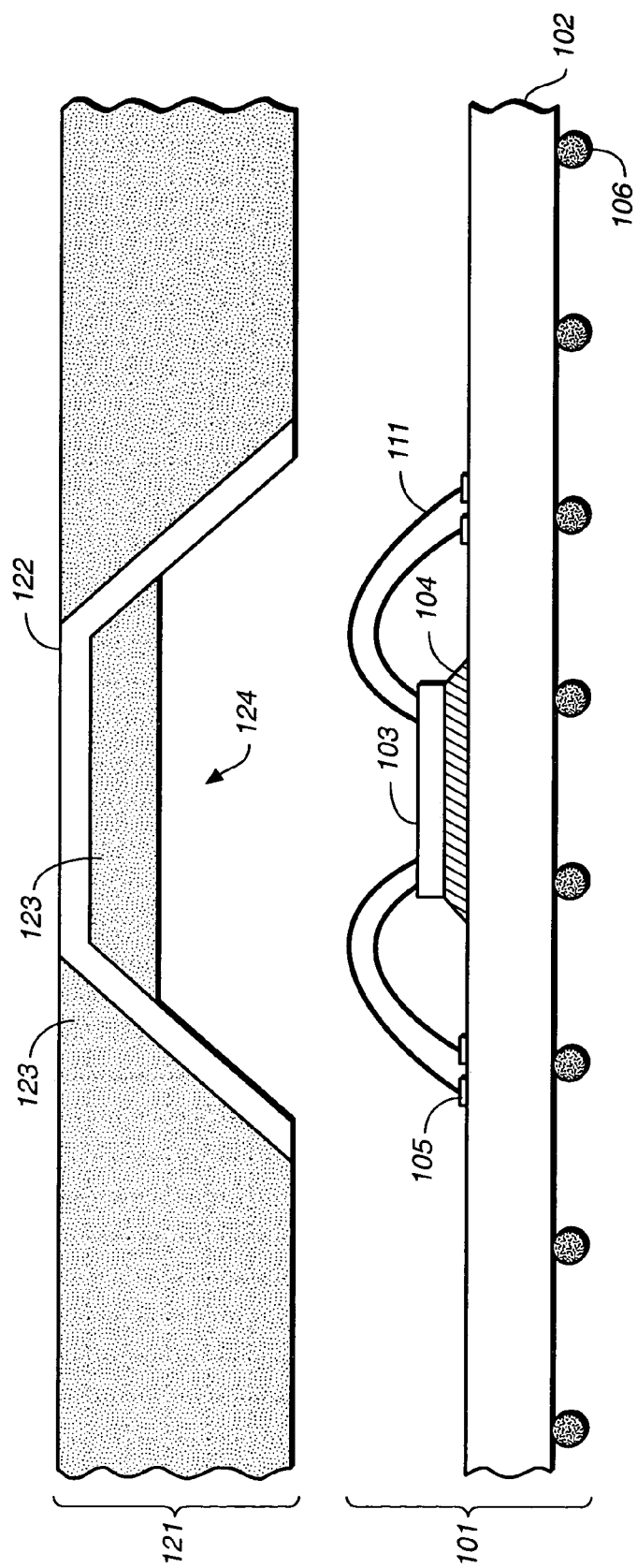
FIG._1

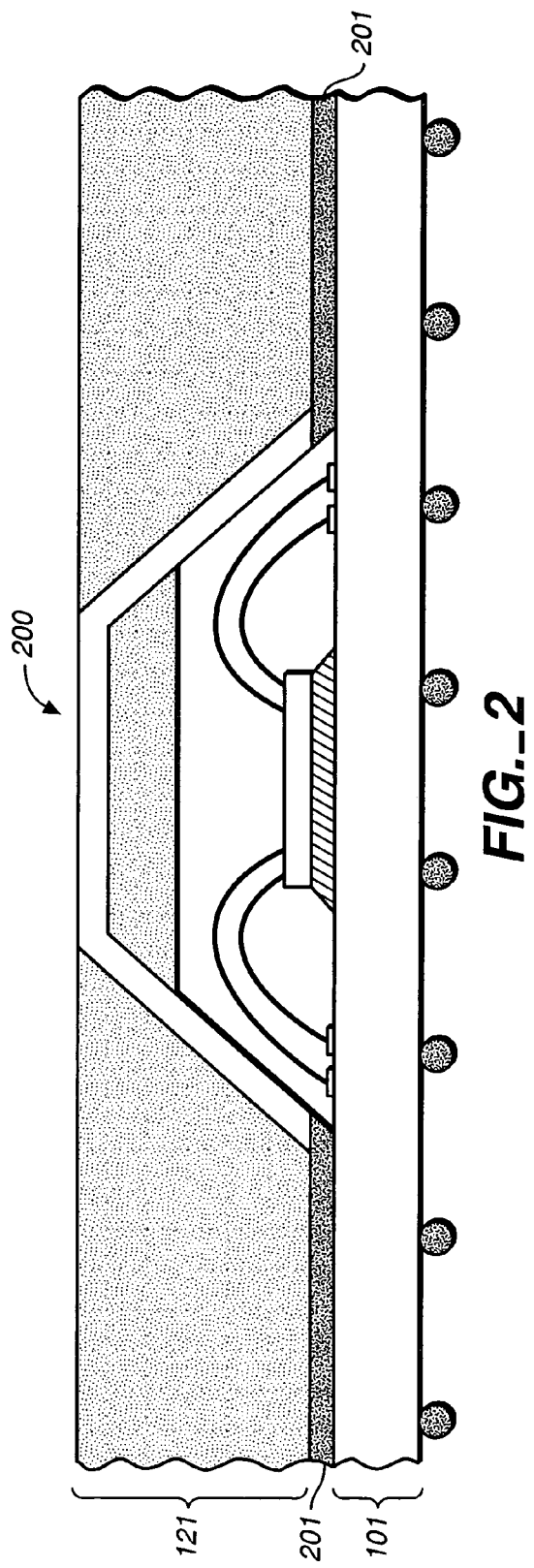
FIG._2
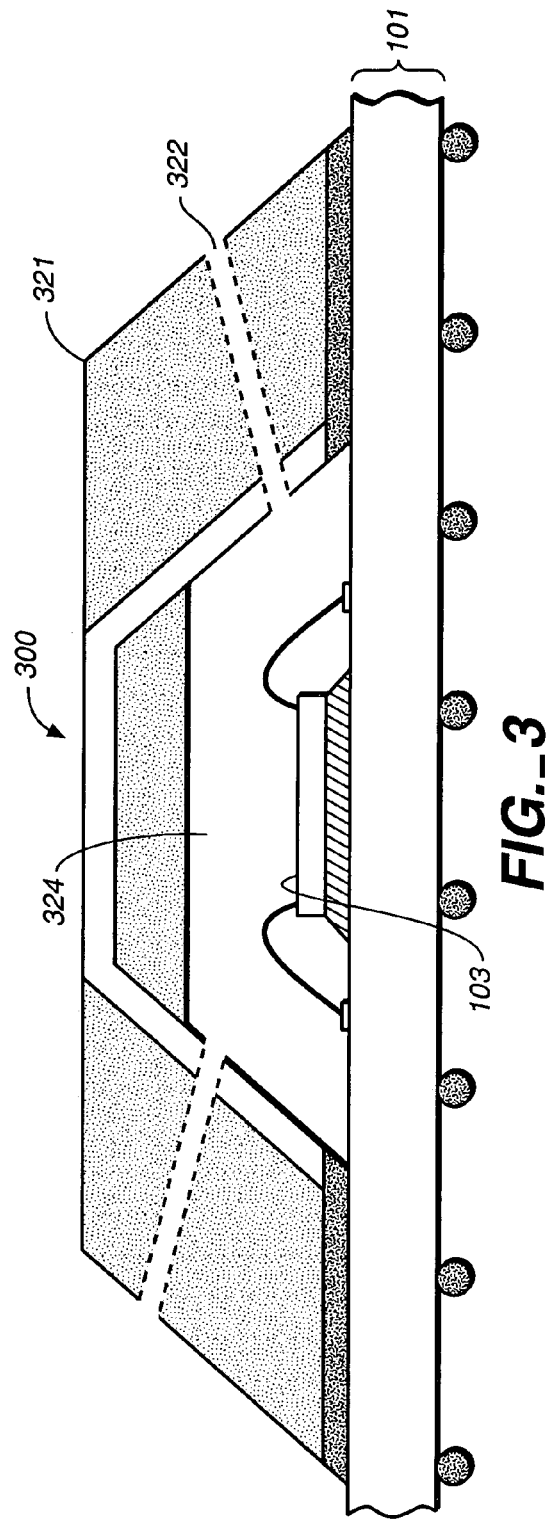
FIG._3

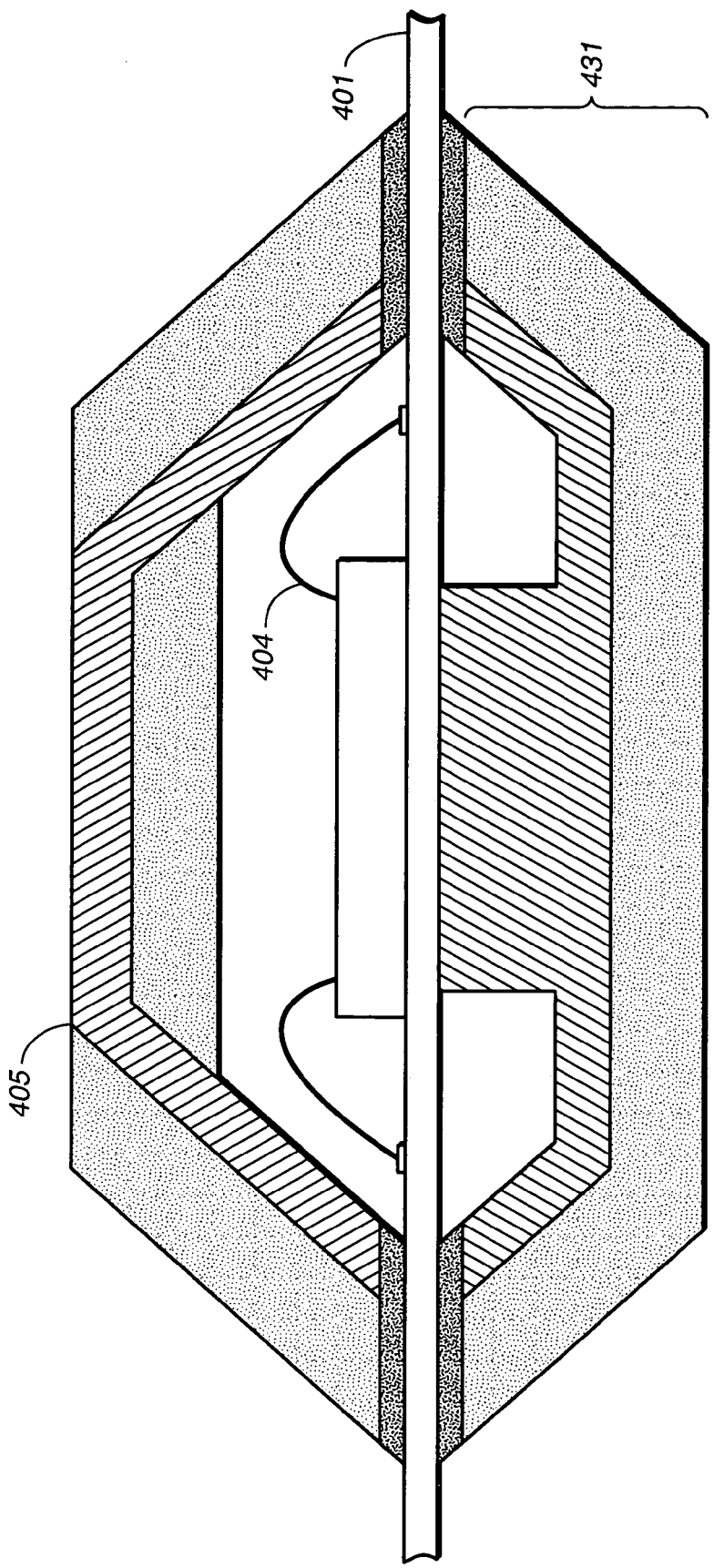
FIG._4

SEMICONDUCTOR PACKAGE AND PROCESS UTILIZING PRE-FORMED MOLD CAP AND HEATSPREADER ASSEMBLY

TECHNICAL FIELD

The invention described herein relates generally to semiconductor device packaging. In particular, the invention relates to a method and package for a semiconductor device that includes a pre-formed heatspreader and encapsulation assembly.

BACKGROUND

The semiconductor industry makes wide use of quick turn around prototype semiconductor devices. The deadlines imposed for the design, fabrication, and final assembly of such devices can be quite short. Increasingly, manufacturers are requiring that their prototypes more closely resemble the projected final product. In order to meet this requirement of a more finished prototype product additional process steps are frequently required to complete the prototypes to a satisfactory degree. Thus, such prototypes are taking increasingly longer to produce. As a result, any time saving design or assembly features are very desirable.

One portion of the fabrication process that can take a significant amount of time is the attachment of a heatspreader to a package and the subsequent encapsulation of the die in the package. This is conventionally a multi-step process requiring the adhesive attachment of a heatspreader to a die package assembly and an associated cure cycle for the adhesive. Additionally, substantial machine set-up time is required to prepare the heatspreader attachment and cure process. A subsequent encapsulation step is used to form a mold cap that encapsulates and protects the die as well as other components of the die package. Again, substantial machine set-up time is required to prepare the packages for encapsulation. Also, encapsulants require significant cure times. All of this contributes significantly to the manufacturing time required to assemble semiconductor die packages. Although such long assembly process times significantly extend semiconductor package assembly times for "production" semiconductor packages, they impose even more significant delays in the fabrication of prototype semiconductor packages which are commonly in need of short turn around times.

Thus, an improved semiconductor package and assembly process capable of reducing the amount of time required to manufacture semiconductor packages is needed.

SUMMARY OF THE INVENTION

In accordance with the principles of the present invention, an improved semiconductor package and methods for its fabrication are disclosed.

One embodiment of the invention comprises a semiconductor integrated circuit package having a substrate with a die attached to the front side of the substrate. The substrate including a plurality of electrical connections formed on the substrate and bonding wires for connecting the die to the electrical connections. The package further including a preformed one-piece integrated mold cap and heatspreader assembly attached to the substrate to enclose at least a portion of the bonding wires and the die.

In another embodiment, the invention includes a premolded one-piece combination heat spreader mold cap assembly for use in semiconductor integrated circuit (IC) packages. The assembly includes a heatspreader portion and an integrated mold cap portion integrally formed onto the heatspreader portion to form a one-piece assembly having a cavity in the mold cap portion, the cavity defining a space for the placement of a semiconductor integrated circuit die and associated wire connections.

A method embodiment includes providing a substrate having a semiconductor integrated circuit die mounted thereon, the substrate having plurality of electrical connections that are connected to the die with a plurality of bonding wires. A preformed one-piece integrated mold cap and heatspreader assembly are also provided. The preformed one-piece integrated mold cap and heatspreader assembly is attached to the substrate to encapsulate at least a portion of the bonding wires and the die thereby forming an IC package.

Other aspects and advantages of the invention will become apparent from the following detailed description and accompanying drawings which illustrate, by way of example, the principles of the invention.

BRIEF DESCRIPTION OF THE DRAWINGS

The following detailed description will be more readily understood in conjunction with the accompanying drawings, in which:

FIG. 1 is a simplified schematic cross-sectional exploded view of portions of an IC package using a premolded one-piece combination heat spreader mold cap assembly to package semiconductor IC chips in accordance with the principles of the invention.

FIG. 2 is a simplified schematic cross-sectional view of a portion of an assembled IC package using a premolded one-piece combination heat spreader mold cap assembly in accordance with the principles of the invention.

FIG. 3 is a simplified schematic cross-sectional view of a portion of an assembled IC package using a premolded one-piece combination heat spreader mold cap assembly having encapsulation ports in accordance with the principles of the invention.

FIG. 4 is a simplified schematic cross-sectional view of a portion of an assembled leadframe IC package using at least one premolded one-piece combination heat spreader mold cap assembly in accordance with the principles of the invention.

It is to be understood that in the drawings like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, semiconductor package embodiments will be disclosed. In particular, the depicted structures show the formation of package embodiments suitable for reducing the assembly and fabrication time necessary for making semiconductor packages.

FIG. 1 is a simplified schematic cross-section view of a portion of an embodiment of the invention. A first portion of a partially fabricated package 101 is depicted. The first portion includes a substrate 102 having a semiconductor integrated circuit (IC) die 103 mounted thereon. The die 103 is typically mounted to the substrate 102 using adhesive 104. Any of a number of commonly used adhesives suitable for such attachment can be used. The substrate 102 can be any substrate commonly used for the fabrication of IC packages. Such substrates 102 include, without limitation, pin grid array (PGA), plastic pin grid array (PPGA), ball grid array (BGA), plastic ball grid array (PBGA), enhanced plastic ball grid array (EPBGA), and other types of array substrates. Additionally, multilevel substrates are typically, but not exclusively, used. Commonly, such substrates 102 includes a core sandwiched between metallization layers. Most commonly, the core is formed of fiber material suspended in a cured a BT (bismaleimide triazine) resin material. This core is then treated to form metallization layers. Commonly, copper materials or coated copper materials are used. Other conductive materials may also be used. The metallization layers can be constructed in many layers. Metal contacts 105 are commonly formed on a top surface of the substrate 102. These contacts 105 are electrically connected with the metallization layers of the substrate 102. Additionally, in some implementations, vias are used to electrically interconnect the contacts 105 with various metallization layers of the substrate as well as solder balls formed on a bottom portion of the substrate 106. Typically, such substrates 102 are very thin, for example, less than about 0.60 mm thick. The methods of fabricating such substrates are very well known to those having ordinary skill in the art. Wire bonds 111 connect the electrical connections of the die 103 to electrical contacts (e.g., bond pads) 105 of the substrate 101. As briefly stated above, vias (not shown in this simplified view) formed in and through the substrate 102 enable the electrical communication between circuitry of the die 103 and the solder balls 106 mounted on the backside of the substrate 102. Thus, partially fabricated packages 101 are in readiness for further processing.

In conventional packaging technologies an encapsulant mold frame is placed on the partially fabricated packages 101 to define a mold space. Subsequently, encapsulant materials are injected into the mold space to encapsulate the die 103 and bond wires 111. The encapsulant is cured and a heatspreader can be placed on the structure. As is commonly known, the cure process can be quite lengthy for many commonly used encapsulant materials. Additionally, the set up time for the machines that position the encapsulant mold frame and inject the encapsulant material can be a very lengthy process taking many hours. Even implementations which use the heatspreader as the mold frame still take considerable time to set up and require significant cure times for the injected encapsulant.

In certain applications, it is extremely important to have a very minimal turn around time. One example is prototyping, where a customer may desire that the design, fabrication, and packaging of a complete semiconductor prototype product be on the order of two or three days. Time lost setting up machines that position an encapsulant mold frame (or even a heatspreader) and inject the encapsulant material impose a critical delay in such short timeline processes. This situation is aggravated still further by the long cure times required by many encapsulant materials. Moreover, such assembly steps also increase the costs of the final product (prototype or otherwise). One embodiment of the invention makes use of a preformed one-piece integrated mold cap and heatspreader assembly. The use of such preformed one-piece integrated mold cap and heatspreader assemblies can be used to reduce the time required for packaging semiconductor device products. Additionally, by having a ready stock of preformed one-piece integrated mold cap and heatspreader assemblies on hand, the costs of such product assembly can be reduced.

Referring again to FIG. 1, one example embodiment of a preformed one-piece integrated mold cap and heatspreader assembly 121 is depicted in cross-section view. The depicted preformed one-piece integrated mold cap and heatspreader assembly 121 embodiment includes a heatspreader portion 122 and a mold cap portion 123 all comprising a single integrated component. The assembly 121 is typically formed having a cavity 124 large enough to enclose the die 103 and wire bonds 111 when it is attached to the substrate 102.

The preformed one-piece integrated mold cap and heatspreader assembly 121 can be formed well in advance of the partially assembled package 101. Thus, all the fabrication and cure steps are already performed. Thus, the time intensive cure and machine set up processes described above are dispensed with and replaced with a simple attachment process. Such attachment could be effectuated using a rapid cure epoxy of a type that is generally known to persons having ordinary skill in the art.

Such a preformed one-piece integrated mold cap and heatspreader assembly 121 can be fabricated using a heatspreader portion 122 which has a mold cap portion 123 formed thereto. Typically, the heatspreader portion 122 is formed of thermally conductive materials such as aluminum, copper, copper aluminum alloys, as well as many other suitable heatspreader materials known to those having ordinary skill in the art. The mold cap portion 123 can be formed onto the heatspreader portion 122 using any of a number of encapsulant materials known to persons having ordinary skill in the art. For example, high thermal compound encapsulants are suitable, as are a number of other encapsulant materials. Particular examples include phenol novolac epoxies such as Plaskon SMT-B1 available from Libbey-Owens-Ford Glass Company. Additionally, ceramic materials can be used as well. These mold cap portions 123 can be formed onto the heatspreader portion 122 using a mold configured to define a cavity 124 in the final assembly 121. The cavity can be formed of any size, but typically the cavity is sized to accommodate standard size dies 103 (and there associated wirebonds 111). The advantage of such preformed assemblies 121 is that they can be formed in a range of sizes and then stored for use whenever needed.

When used in a prototype implementation, such preformed one-piece integrated mold cap and heatspreader assemblies 121 avoid the need for an encapsulation step (avoiding the need for machine set up and encapsulant injection steps) and an encapsulant curing step. This time savings can amount to as much as 24 hours. In a three day cycle time this is a very helpful attribute of the invention.

FIG. 2 is a simplified schematic cross-section view of a portion of an assembled package 200 embodiment of the invention. The preformed one-piece integrated mold cap and heatspreader assembly 121 is treated with and adhesive 201 and then attached with the first portion 101 of the package. Typically, a short cure time adhesive is used. Following a brief cure the package 200 is complete.

FIG. 3 depicts yet another implementation. In the depicted package 300, the preformed one-piece integrated mold cap and heatspreader assembly 321 includes at least one opening 322 that is in communication with a cavity 324 in the assembly 321. In the depicted embodiment, the opening 322 is configured so that an encapsulation material can be introduced into the cavity 324. In such a manner the die 103 can be completely encapsulated if desired. Moreover, the encapsulation material can be the same as used to manufacture the assembly 321 or a different material. In one example, a second encapsulation material having a faster cure time can be employed.

In other embodiments, the principles of the invention can be applied to a leadframe packages (those with leads rather than solder balls), or chip scale packages (those that are 15×15 mm² or smaller).

FIG. 4 depicts an implementation of the principles of the invention as applied to a leadframe embodiment. A leadframe 401 has a die 103 formed thereon. Such a die 103 can be wire bonded 404 to leads of the leadframe 401. A preformed one-piece integrated mold cap and heatspreader assembly 405 can be attached to the leadframe 401. Additionally, a second preformed one-piece integrated mold cap and heatspreader assembly 431 can be attached to the bottom side of the leadframe 431 to complete the package. Such a second preformed one-piece integrated mold cap and heatspreader assembly 431 is formed using generally the same materials as used for the assemblies described hereinabove. Such assemblies 405, 431 are typically attached to the leadframe 401 using adhesives, but other methods of attaching the assemblies 405, 431 are contemplated by the inventors.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that many different sizes and shapes can be implemented in preformed one-piece integrated mold cap and heatspreader assemblies in accordance with the principles of the invention. Moreover, the inventors contemplate that many of the embodiments described herein can be applied to more than just prototype packaging implementation. For example, the preformed assemblies can be used in low cost chip packages where reliability concerns are not as important (toys, disposable items, etc.). Although only a few configurations are expressly disclosed herein, it should be appreciated by anyone having ordinary skill in the art that, using the teachings disclosed herein, many different package configurations can be implemented and still fall within the scope of the claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A semiconductor integrated circuit (IC) package which comprises:
   a substrate having a front side and a back side;
   a die attached to the front side of the of the substrate;
   a plurality of electrical connections formed on the substrate;
   bonding wires for connecting the die to the plurality of electrical connections; and
   a mold cap and heatspreader assembly attached to the substrate to form an enclosure which contains the die and is arranged so that a portion of the mold cap is interposed between the heatspreader and the die, the assembly attached to the substrate with a layer of epoxy material arranged to adhere the substrate to the mold cap to enclose at least a portion of the bonding wires and the die.

2. A semiconductor integrated circuit (IC) package as recited in claim 1 wherein the mold cap and heatspreader assembly is adhered to the substrate with quick drying epoxy arranged between the substrate and the assembly, the adhered assembly enclosing at least a portion of the bonding wires and the die in the cavity.

3. The IC package of claim 1 wherein the preformed one-piece integrated mold cap and heatspreader assembly includes a mold cap portion comprised of encapsulant material and a heatspreader portion comprised of thermally conductive material.

4. The IC package of claim 3 wherein the preformed one-piece integrated mold cap and heatspreader assembly includes a cavity formed in the encapsulant material comprising the mold cap wherein the cavity is configured to fit over the bonding wires and the die when the preformed one-piece integrated mold cap and heatspreader assembly is attached to the substrate.

5. The IC package of claim 4 wherein the mold cap of the preformed one-piece integrated mold cap and heatspreader assembly comprises a plastic encapsulant material.

6. The IC package of claim 4 wherein the mold cap of the preformed one-piece integrated mold cap and heatspreader assembly comprises a ceramic encapsulant material.

7. The IC package of claim 4 wherein the IC package comprises a prototype IC package.

8. The IC package of claim 2 wherein the substrate comprises one of a EPBGA substrate, BGA substrate, PBGA substrate, PGA substrate, PPGA substrate.

9. A semiconductor integrated circuit (IC) package which comprises:
   a substrate having a front side and a back side;
   a die attached to the front side of the of the substrate;
   a plurality of electrical connections formed on the substrate;
   bonding wires for connecting the die to the plurality of electrical connections; and a preformed one-piece integrated mold cap and heatspreader assembly attached to the substrate with a layer of epoxy material arranged to adhere the substrate to the mold cap to enclose at least a portion of the bonding wires and the die wherein at least some of the mold cap is formed underneath a top portion of the heat spreader filling a portion of a cavity in which the bonding wires and the die are enclosed.

10. A semiconductor integrated circuit (IC) package recited in claim 9 wherein the portion of the mold cap formed underneath the top portion of the heat spreader is not in contact with the die.

11. A semiconductor integrated circuit (IC) package as recited in claim 9 wherein the mold cap comprises an insulating material including the portion of the mold cap formed underneath a top portion of the heat spreader.

12. A semiconductor integrated circuit (IC) package as recited in claim 11 wherein the mold cap comprises a thermally insulating material.

13. A semiconductor integrated circuit (IC) package as recited in claim 12 wherein the mold cap comprises a phenol novolac epoxy.

14. A semiconductor integrated circuit (IC) package as recited in claim 12 wherein the mold cap comprises a ceramic material.

* * * * *